(12) United States Patent
Tanaka

(10) Patent No.: US 7,681,162 B2
(45) Date of Patent: Mar. 16, 2010

(54) STANDARD CELL, CELL LIBRARY USING A STANDARD CELL AND METHOD FOR ARRANGING VIA CONTACT

(75) Inventor: Satoshi Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 451 days.

(21) Appl. No.: 11/616,103

(22) Filed: Dec. 26, 2006

(65) Prior Publication Data

US 2007/0152243 A1    Jul. 5, 2007

(30) Foreign Application Priority Data

Dec. 26, 2005   (JP)   ............................... 2005-373399

(51) Int. Cl.
*G06F 17/50*   (2006.01)
(52) U.S. Cl. ........................................................ 716/7
(58) Field of Classification Search .................. 716/7
See application file for complete search history.

(56) References Cited

FOREIGN PATENT DOCUMENTS

| EP | 1 065 721 A2 | * | 1/2001 |
|---|---|---|---|
| JP | 2000-269346 | | 9/2000 |

* cited by examiner

*Primary Examiner*—Evan Pert
(74) *Attorney, Agent, or Firm*—Oblon, Spivak, McClelland, Maier & Neustadt, L.L.P.

(57) ABSTRACT

According to an aspect of the present invention, there is provided a standard cell, including a cell frame having a rectangular region, a power supply interconnection, a center line of the power supply interconnection overlapping with a side line along a first direction of the cell frame, a via contact, the center of the via contact overlapping with the center line of the power supply interconnection and a grid having a minimum interval in a layout of the via contacts, wherein a width of the cell along the first direction is an integral multiplication of the grid and the center of the via contact is at a distance of at least 1.5 multiplication of the grid from the nearest apex in the cell frame.

17 Claims, 9 Drawing Sheets

US 7,681,162 B2

STANDARD CELL, CELL LIBRARY USING A STANDARD CELL AND METHOD FOR ARRANGING VIA CONTACT

CROSS REFERENCE TO RELATED APPLICATION

This application is based upon and claims the benefit of priority from the prior Japanese Patent Application No. JP2005-373399, filed on Dec. 26, 2005; the entire contents of which are incorporated herein by reference.

Field of the Invention

The present invention relates to a standard cell, a cell library using the standard cell and a method for arranging a via contact, and in particular, to a layout design.

Description of the Background

Progress of fabricating technology of a semiconductor device in recent years has promoted development of a semiconductor device which has stored a complicated system in one chip. In designing such a semiconductor device, an automatic arrangement program generally performs a layout design of the semiconductor device. A cell library which has a standard cell is used when the layout of the semiconductor device is designed.

However, an interaction between standard cells adjacently arranged is not reflected in a conventional layout design. For example, via contacts arranged on a power supply in a standard cell may be adjoined between the standard cells. For another example, three or more via contacts may be continuously arranged. Specifically, the following cases are corresponding to the arrangement of the via contacts mentioned above. For example, when the standard cell is arranged, the via contacts in the cell adjoins within the cell column of a same horizontal direction. For another example, the via contacts and the cell columns arranged by adjoining upper and lower regions share the power supply interconnection.

On the other hand, while miniaturization of the semiconductor fabricating process proceeds, three or more via contacts adjoined at the minimum interval causes a problem based on light interference phenomena in an exposure process. The problem is that a part of the via contacts are no longer formed as a size in the design rule. Therefore, when the layout design is performed, it is necessary to set restrictions on the continuous arrangement of the via contacts in the design rule.

In order to avoid such a problem, several methods are proposed. For example, after the arrangement of the all standard cells by the automatic arrangement program is completed without the data of the via contact in the standard cell, the via contact is arranged on the power supply interconnection in consideration of the design rule as another way. This method is disclosed in Japanese Patent Publication (Kokai) No. 2000-269346. However, in such a method, it is necessary to perform again on the arrangement of the via contact, whenever an exchange and/or a correction based on a simulation are generated between the cells. Furthermore, as a target circuit size becomes large, processing time of the layout design may drastically become long.

SUMMARY OF THE INVENTION

According to an aspect of the invention, there is provided a standard cell including a cell frame having a rectangular region, a power supply interconnection, a center line of the power supply interconnection overlapping with a side line along a first direction of the cell frame, a via contact, the center of the via contact overlapping with the center line of the power supply interconnection and a grid having a minimum interval in a layout of the via contacts, wherein a width of the cell along the first direction is an integral multiplication of the grid and the center of the via contact is at a distance of at least 1.5 multiplication of the grid from the nearest apex in the cell frame.

Further, another aspect of the invention, there is provided, a cell library including a cell frame having a rectangular region, a power supply interconnection, a center line of the power supply interconnection overlapping with a side line along a first direction of the cell frame, a via contact, the center of the via contact overlapping with the center line of the power supply interconnection, and a grid having a minimum interval in a layout of the via contacts a standard cell having the center of the via contact being at a distance of at least 1.5 multiplication of the grid from the nearest apex in the cell frame, wherein a width of the cell along the first direction is an integral multiplication of the grid and the plurality of standard cells have the cell frame with a same height along a second direction perpendicular to the first direction.

Further, another aspect of the invention, there is provided a method for arranging a via contact including forming a cell frame having a rectangular region as a standard cell, a width of the cell along a first direction of the cell frame being an integral multiplication of a grid, the grid being a minimum interval in a layout of a via contact, arranging a power supply interconnection, a center line of the power supply interconnection overlapping with a side line along the first direction of the cell frame, and arranging the via contact, the center of the via contact overlapping with the center line of the power supply interconnection, and the center of the via contact being at a distance of at least 1.5 multiplication of the grid from the nearest apex in the cell frame.

DETAILED DESCRIPTION OF THE INVENTION

An embodiment of the present invention will be described below in detail with reference to the drawings mentioned above.

Figure 1:
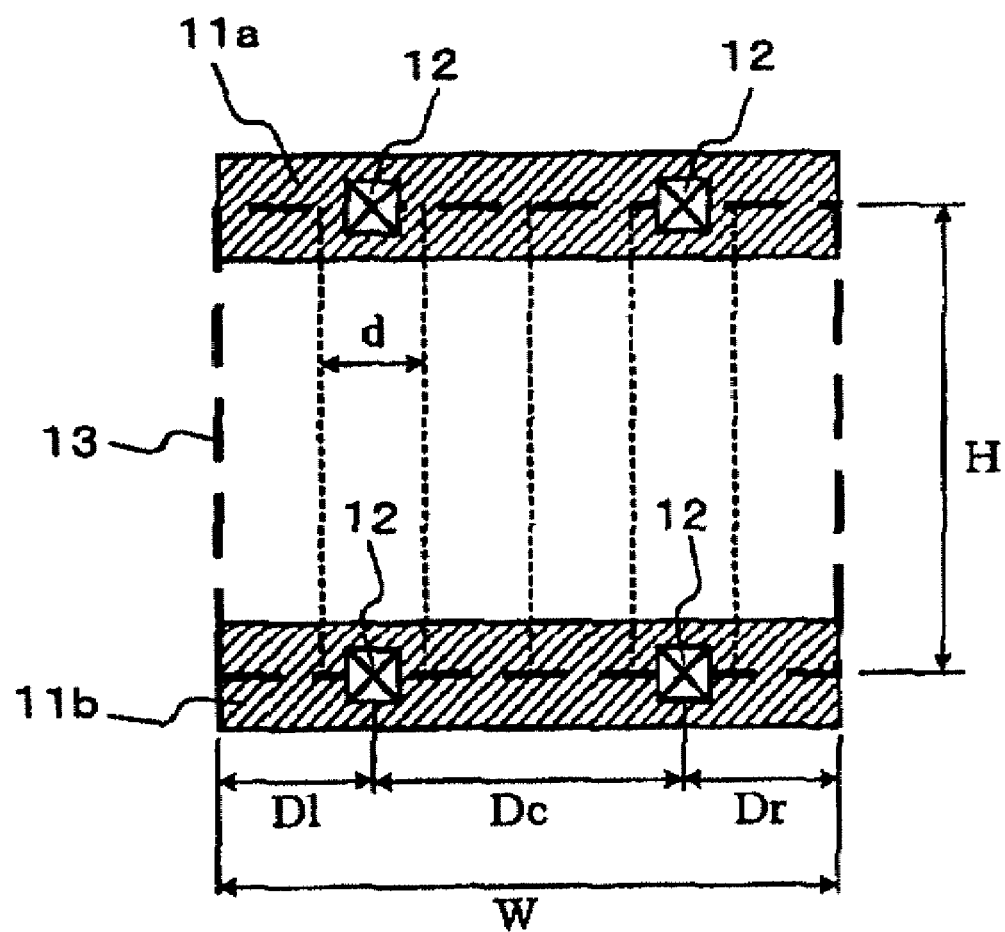
FIG. 1 is a layout chart showing a standard cell according to an embodiment of the present invention.

FIG. 1 is a layout chart showing a standard cell according to the embodiment of the present invention. Here, FIG. 1 mainly shows a via contact 12 on a power supply interconnections 11a and 11b, and a portion related to an arrangement of the via contact 12.

The standard cell according to the embodiment of the present invention includes a cell frame 13 having a rectangular region, the power supply interconnections 11a and 11b arranged along the upper and lower sides opposed to each other in the cell frame 13, and the plurality of via contacts 12 arranged on the power supply interconnections 11a and 11b.

The cell frame 13 is a virtual rectangular region. The region is used when an automatic layout program arranges the plurality of standard cells. In performing the layout, the cell frames are arranged without crossing each other. A width W of the cell frame is an integral multiplication of an interval d. Hereafter, the interval d is called a grid. The grid is a minimum value in adjacently arranging the via contacts 12. Furthermore, a height H of the cell frame is the same value in a cell library.

As shown in FIG. 1, the power supply interconnections 11a and 11b are arranged so that the center line of the power supply interconnections overlaps with the upper and lower sides of the cell frame. Finally, the layout arrangement of the standard cell is finished by the automatic layout program. As a result, the power supply interconnection of the upper region is connected to the power supply voltage and the power supply interconnection of the lower region is connected to the earth potential. The power supply interconnections 11a and 11b are arranged as mentioned above. The interconnection of the power supply voltage and the earth potential is alternately formed with passing through the layout area to horizontal direction, when the standard cell is vertically and horizontally arranged so as to obtain a close packing layout.

The via contact 12 act as a through hole to electrically connect the power supply interconnections 11a and 11b, and a substrate. The via contact 12 is used for connecting the power supply voltage and an N-well region in the substrate, and connecting the earth potential and a P-well region in the substrate.

As shown in FIG. 1, the via contact 12 is arranged so that the center of the via contact 12 overlaps with the center line of the power supply interconnections 11a and 11b. Further, the via contact 12 is arranged at a distance of 1.5d from the apex of the cell frame. The adjacent via contacts 12 disposed on the same power supply interconnection are arranged mutually apart at the interval of 3d.

The standard cell having the width W of 6d in the cell frame is shown in FIG. 1, for example. Except the width W of 6d, the via contact 12 is arranged below, $$Dc = 3d$$

$$Dl \geq 1.5d$$

$$Dr \geq 1.5d \quad (1)$$

where Dc is a interval of the via contact 12, Dl and Dr are intervals between the via contact 12 and the apex of the nearest cell frame, respectively.

Figure 2:
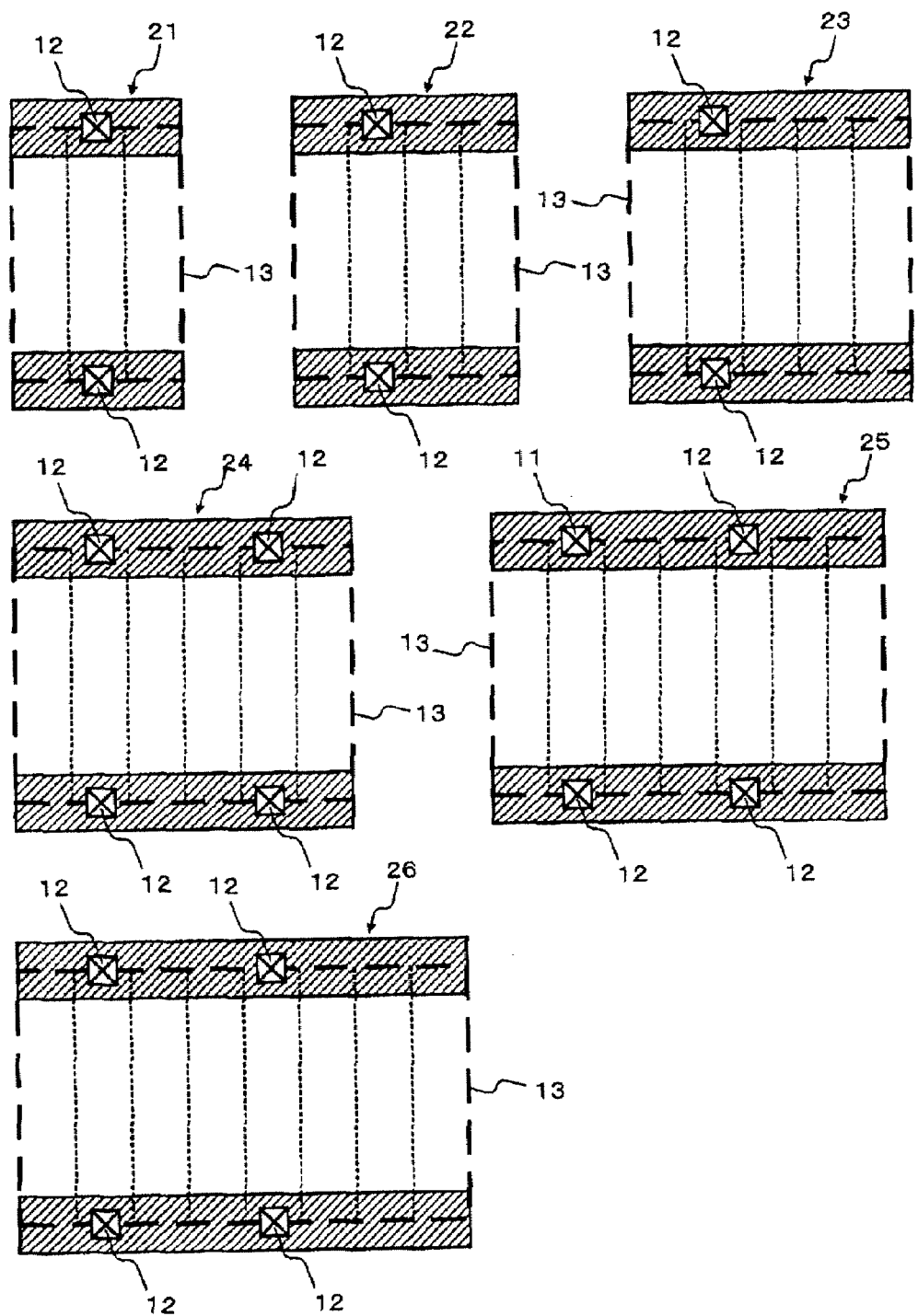
FIG. 2 is a layout chart showing a cell library using the standard cell according to the embodiment of the present invention.

FIG. 2 is a layout chart showing a cell library using the standard cell according to the embodiment of the present invention. Here, FIG. 2 shows the standard cell having a cell width W.

The cell library using the standard cell includes the plurality of standard cells having the same cell height H and different cell width W according to the embodiment of the present invention.

As shown in FIG. 2, the standard cells 21-23 having the width W of 3d-5d include the via contact 12 on the upper and lower power supply interconnections 11a and 11b, respectively. These via contacts 12 are arranged at the distance of 1.5d from the left end of the cell frame as satisfying the equation (1).

As shown in FIG. 2, the standard cell 24-26 having the width W of 6d-8d include the two via contacts 12 on the upper and lower power supply interconnections 11a and 11b, respectively. These via contacts 12 are arranged that the one of the via contacts 12 is set at the distance of 1.5d from the left end of the cell frame and the other of the via contacts 12 is further set at the distance of 3d from the one of the via contacts 12 as satisfying the equation (1).

As not shown in FIG. 2, however, in the standard cell having over the width W of 9d, the via contact 12 on the upper and lower power supply interconnections 11a and 11b is added one by one as increasing with the width W of 3d. Furthermore, as the same as the standard cell 24-26, the via contact 12 is arranged in the standard cell having over the width W of 9d as satisfying the equation (1). On the other hand, the via contact 12 is not arranged in the standard cell having the width W of 1d and 2d.

Figure 3:
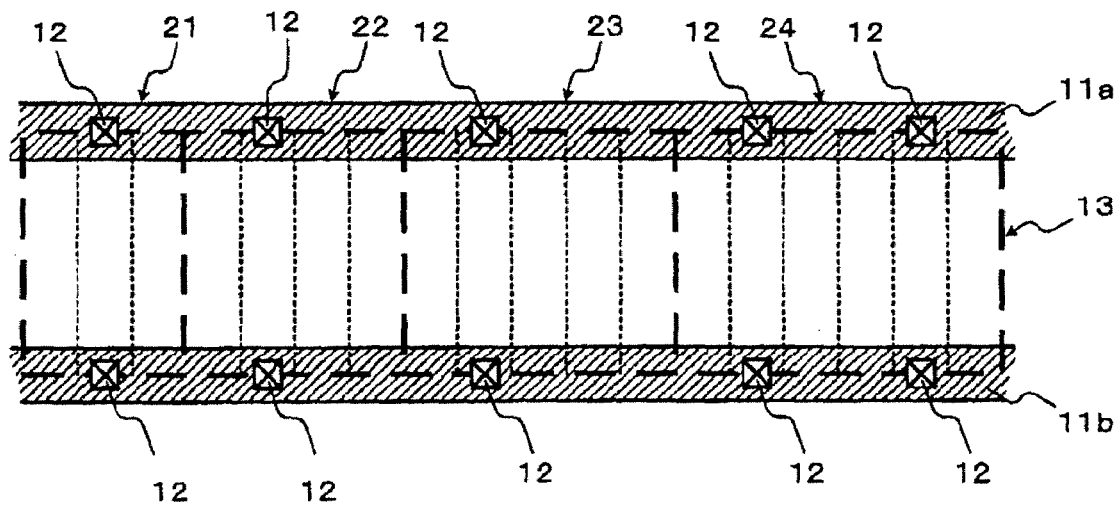
FIG. 3 is a layout chart showing an arrangement of the via contacts in the cell column by using the standard cell according to the embodiment of the present invention.

Next, an arrangement of the cell column is explained. In this case, the plurality of standard cells are adjacently disposed along the horizontal direction according to the embodiment of the present invention. FIG. 3 is a layout chart showing an arrangement of the via contacts 12 in the cell column having the standard cell according to the embodiment of the present invention. Here, FIG. 2 shows the standard cell 21-24 having cell the width W of 3d-6d being adjacently arranged along the horizontal direction in order.

The via contact 12 of the standard cell 21-24 are all arranged as satisfying the equation (1). As shown in FIG. 3, all the via contacts 12 of the cell column arranged in order have the interval of over 3d. As a result, the via contact 12 between the standard cell 21 and the standard cell 22 has the interval of 3d. The via contact 12 between the standard cell 22 and the standard cell 23 has the interval 4d. The via contact 12 between the standard cell 23 and the standard cell 24 have the interval of 5d. Furthermore, the two via contacts 12 in the standard cell 24 have the interval of 3d derived from the equation (1).

Here, in the case that some of the standard cells 21-24 are horizontally reversed in the arrangement, however, the interval of the via contact 12 can be easily estimated over 3d. Moreover, in the case that the standard cell 21-24 is arranged arbitrary in order, the interval of the via contact 12 can be easily estimated over 3d.

Furthermore, in the case that the standard cell has the width W of over 7d, the interval of the via contact 12 can be easily estimated over 3d in the condition of the equation (1). The via contact 12 arranged in the standard cell has the interval of 3d derived from the equation (1). In the case that the width W is (3n+1)d, where n is integer number more than one, the width W is 4d. In the case that the width W is (3n+2)d, the width W is 5d.

Figure 4:
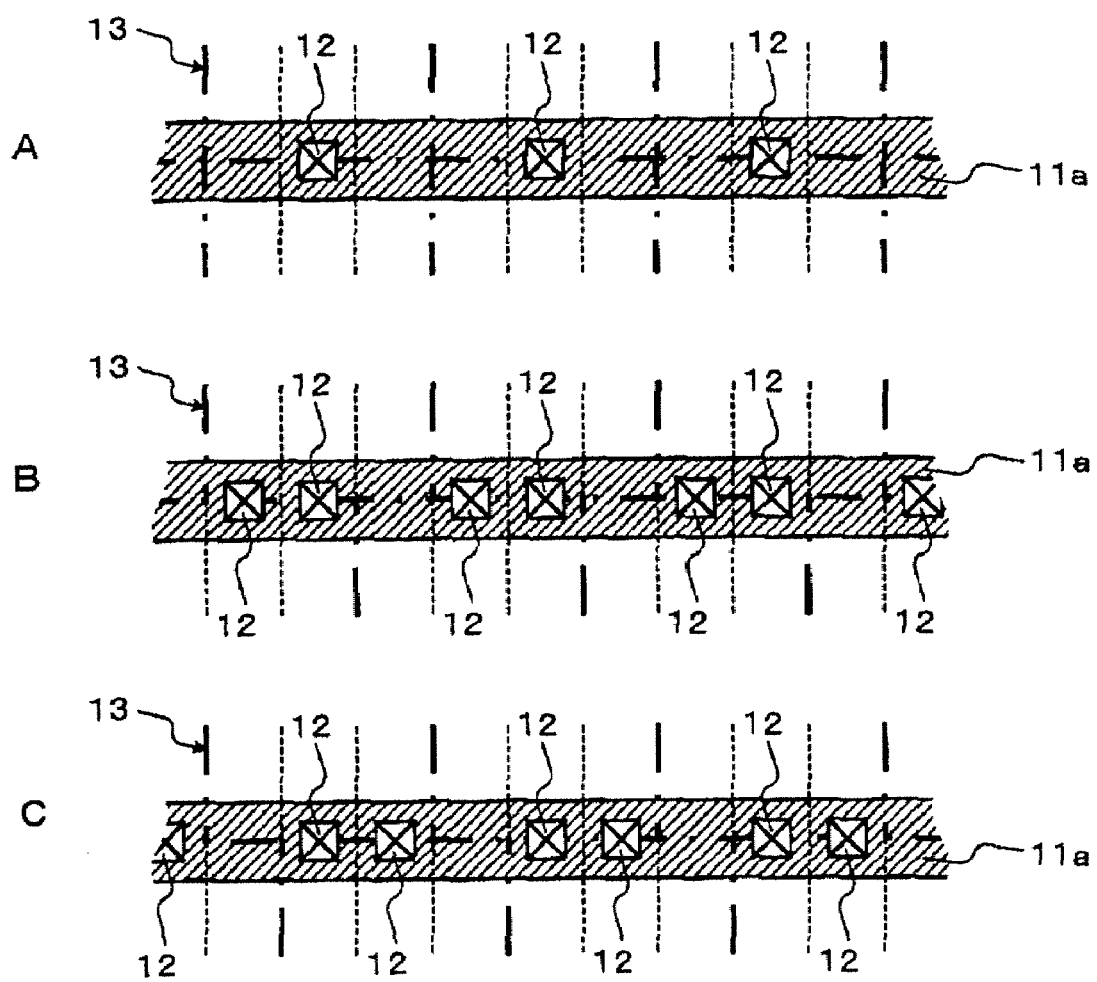
FIGS. 4A-4C are layout charts showing standard cells 21 vertically arranged to share a power supply interconnection according to the embodiment of the present invention.

Next, another arrangement of the cell column is explained. FIG. 4 is a layout chart showing the standard cell 21 according to the embodiment of the present invention. The standard cells are arranged an upper layer and a lower layer to share the power supply interconnections. Here, a combination of the standard cells having the width W of 3d is shown in FIG. 4, where the standard cells are vertically and horizontally arranged as a close packing layout.

In FIG. 4A, the upper and the lower standard cells 21 are arranged so that the via contact 12 in the two lower standard cells mutually overlaps. The via contacts 12 of the power supply interconnection 11a are arranged in FIG. 4A. The standard cell arranged at the upper region is vertically reversed to share the power supply interconnection 11a with the standard cell arranged at the upper region. The standard cells in FIG. 4B, 4C and FIG. 5-FIG. 9 are also vertically reversed as the same as FIG. 4A.

In the cell arrangement as shown in FIG. 4A, the via contacts 12 of the upper and the lower standard cells are all arranged to mutually overlap. After arranging, via contacts 12 are formed mutually apart the width W of 3d.

As shown in FIG. 4B, the via contact 12 of the upper standard cell is misaligned to the lower standard cell for one grid. The via contact 12 of the power supply interconnection 11a is shown, where the upper standard cell 21 is misaligned the width W to the right side for the lower standard cell 21.

In this case, as shown in FIG. 4B, the two via contacts 12 are formed to make a continuous grid. However, the via contact 12 of each standard cell 21 is apart at least the width W of 1.5d from the end of the cell frame. Therefore, the three or more via contacts 12 are not continuously arranged.

The via contact 12 of the power supply interconnection 11a is shown in FIG. 4C, where the upper standard cell is misaligned the width W to the left side for the lower standard cell. Therefore, in this case, the three or more via contacts 12 are not continuously formed as the same as in FIG. 4B.

Figure 5:
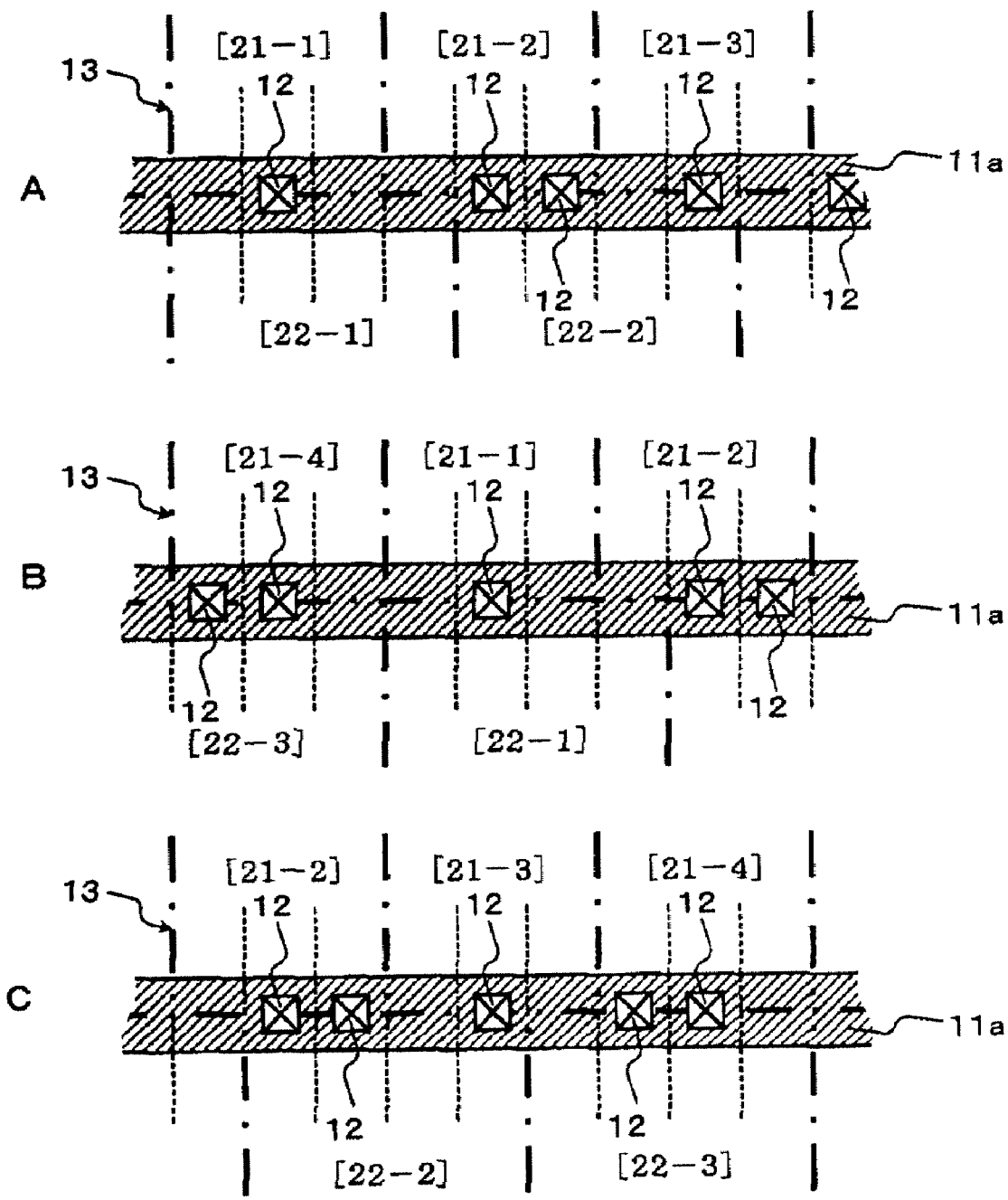
FIGS. 5A-5C are layout charts showing the standard cells 21 and standard cells 22 vertically arranged to share the power supply interconnection according to the embodiment of the present invention.

FIG. 5 is a layout chart showing the standard cell 21 and the standard cell 22 according to the embodiment of the present invention. The standard cells 21 and 22 are arranged in an lower layer and a upper layer, respectively, to share the power supply interconnections. Here, a combination of the standard cells 21 and 22 is shown in FIG. 5, where the standard cell 21 having the width W of 3d is arranged in the lower layer and the standard cell 22 having the width W of 4d is arranged in the upper layer. In this case, the combination of the four standard cells 21([21-1]-[21-4] in FIG. 5) and the three standard cells 22([22-1]-[21-3] in FIG. 5) are repeatedly arranged.

In FIG. 5A, the combination of the standard cells 21, 22 ([21-1]-[21-3] and [22-1]-[22-2]) are illustrated. In FIG. 5B, the combination of the standard cells 21, 22 ([21-4], [21-1], [21-2] and [22-3], [22-1]) are illustrated. In FIG. 5C, the combination of the standard cells 21, 22([21-2]-[21-4] and [22-2], [22-3]) are illustrated.

The via contacts 12 is formed as the continuous grids by the combinations as shown in FIG. 5. As a result, a maximum number of the continuous grid is two. Three or more via contacts 12 are not continuously formed. Moreover, in the case that one of the standard cells 22 is horizontally arranged in reverse, however, the discussion mentioned above can be easily estimated the same as the normal case.

Figure 6:
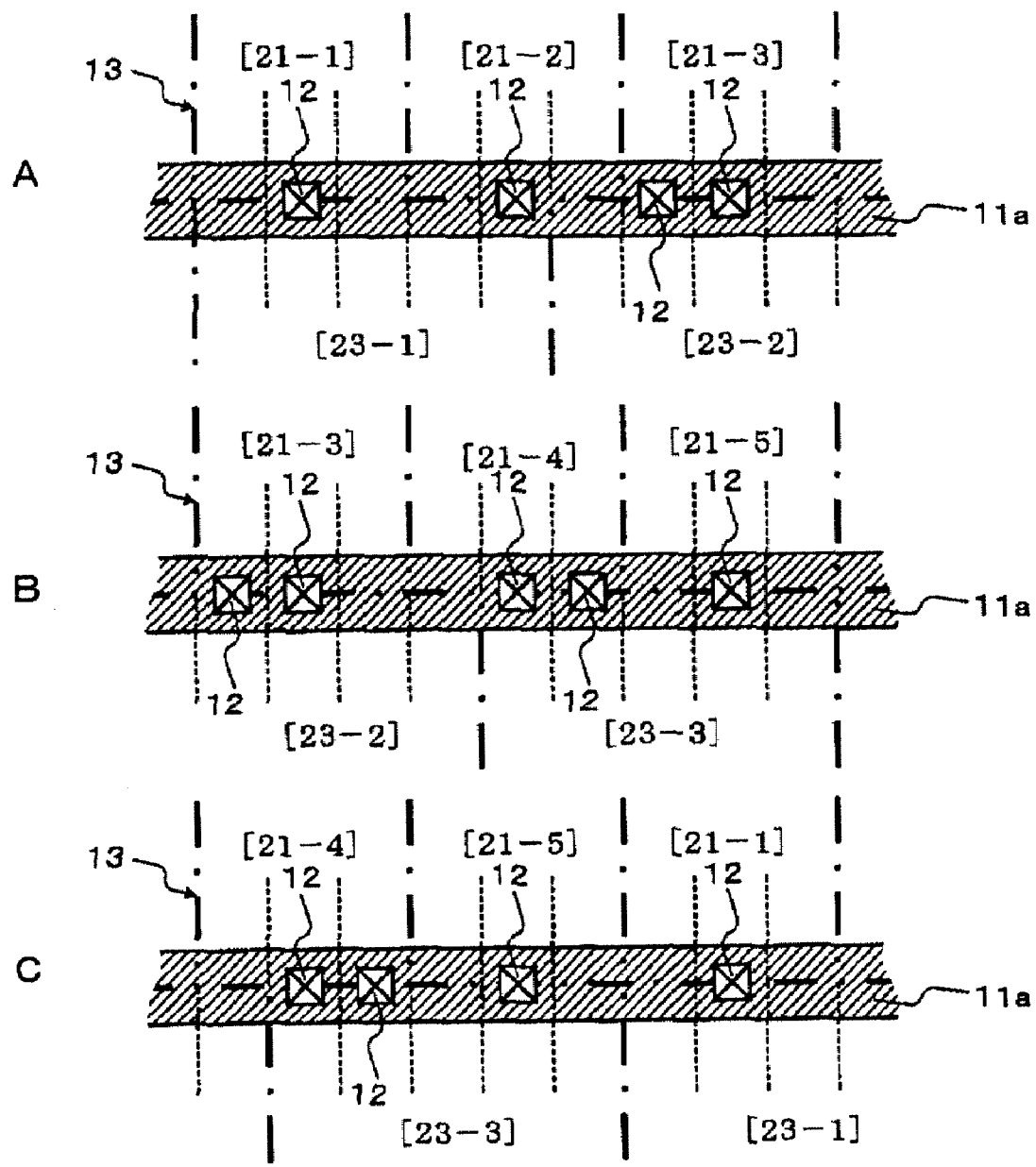
FIGS. 6A-6C are layout charts showing the standard cells 21 and the standard cells 22 vertically arranged to share the power supply interconnection according to the embodiment of the present invention.

FIG. 6 is a layout chart showing the standard cell 21 and the standard cell 23 according to the embodiment of the present invention. The standard cells 21, 23 are arranged an upper layer and a lower layer, respectively, to share the power supply interconnections. Here, a combination of the standard cells 21, 23 is shown in FIG. 6, where the standard cell 21 having the width W of 3d is arranged in the lower layer and the standard cell 23 having the width W of 5d is arranged in the upper layer. In this case, combinations of the five standard cells 21([21-1]-[21-5] in FIG. 6) and the three standard cells 23([22-1]-[21-3] in FIG. 6) are repeatedly arranged.

In FIG. 6A, the combination of the standard cells 21,23 ([21-1]-[21-3] and [23-1]-[23-2]) are illustrated. In FIG. 6B, the combination of the standard cells 21, 23([21-3]-[21-5], and [23-2], [23-3]) are illustrated. In FIG. 5C, the combination of the standard cells 21, 23([21-4]-[21-5] and [21-1], [23-3], [22-1])are illustrated.

The via contacts 12 is formed as the continuous grid by the combinations as shown in FIG. 6. As a result, a maximum number of the continuous grid is two. Three or more via contacts 12 are not continuously formed. Moreover, in the case that one of the standard cells 23 is horizontally arranged in reverse, however, the discussion mentioned above can be easily estimated the same as the normal case.

Figure 7:
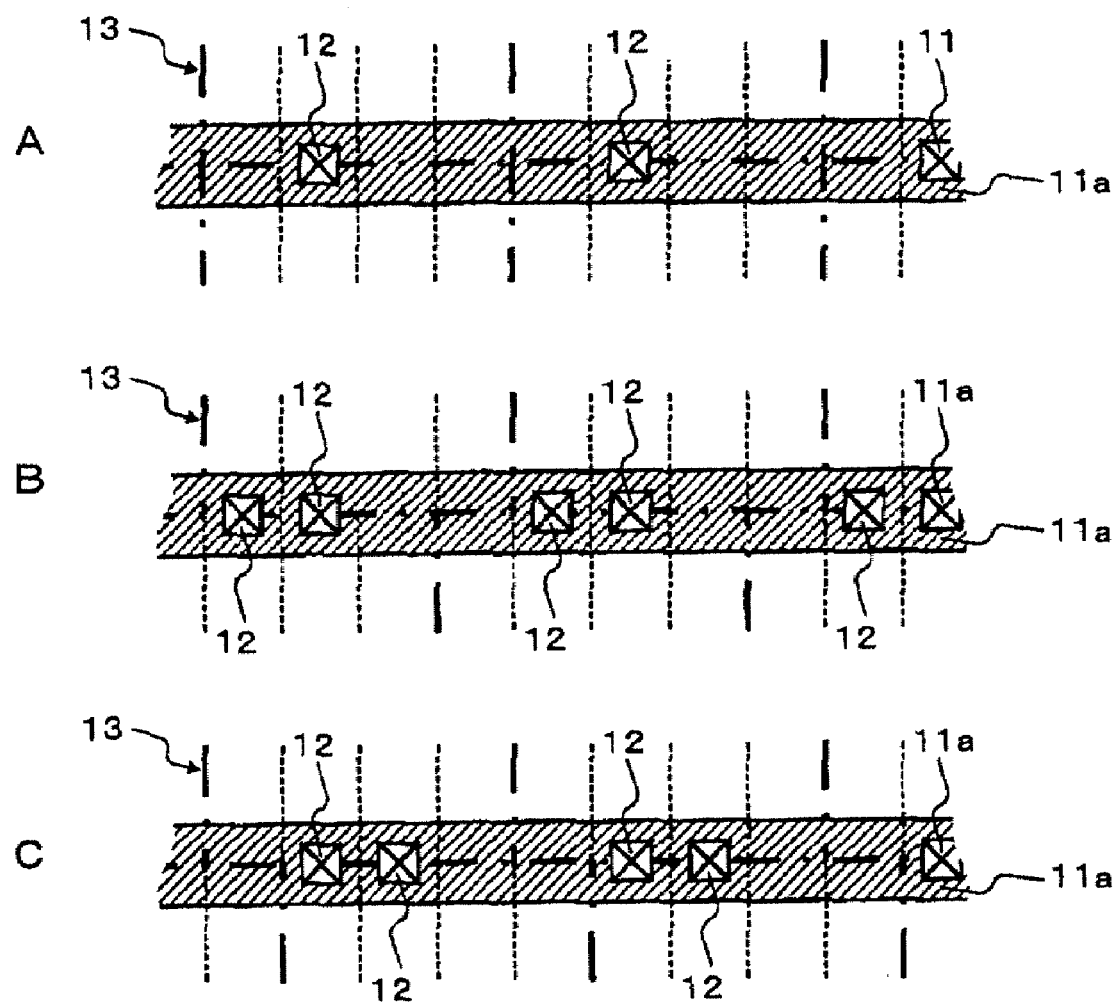
FIGS. 7A-7C are layout charts showing the standard cells 21 vertically arranged to share the power supply interconnection according to the embodiment of the present invention.

FIG. 7 is a layout chart showing the standard cells 22 according to the embodiment of the present invention. The standard cells are arranged an upper layer and a lower layer to share the power supply interconnections. Here, a combination of the standard cells having the width W of 4d is shown in FIG. 7, where the standard cells are vertically and horizontally arranged as a close packing layout.

In FIG. 7A, the upper and the lower standard cells are arranged so that the via contact 12 in the upper and the lower standard cells overlaps each other. The via contacts 12 of the power supply interconnection 11a are arranged in FIG. 7A.

In the cell arrangement as shown in FIG. 7A, the via contacts 12 of the upper and the lower standard cells 22 are all arranged to overlap mutually. After arranging, via contacts 12 are formed mutually apart the width W of 3d.

The via contact 12 of the power supply interconnection 11a is shown in FIG. 7B, where the upper standard cell is misaligned the width W to the right side for the lower standard cell.

In this case, as shown in FIG. 7B, the two via contacts 12 are formed to make the continuous grid. However, the via contact 12 of each standard cell 21 is apart at least the width W of 1.5d from the end of the cell frame. Therefore, the three or more via contacts 12 are not continuously arranged.

The via contact 12 of the power supply interconnection 11a is shown in FIG. 7C, where the upper standard cell is misaligned the width W to the right side for the lower standard cell. Therefore, in this case, the three or more via contacts 12 are not continuously formed as the same as in FIG. 4B.

Furthermore, as not shown in FIG. 7, however, the via contact 12 is formed at the equal interval of 2d in the case that the upper and the lower standard cells are misaligned mutually the width W of 2d. As a result, the grids being not continuously formed can be easily estimated.

Figure 8:
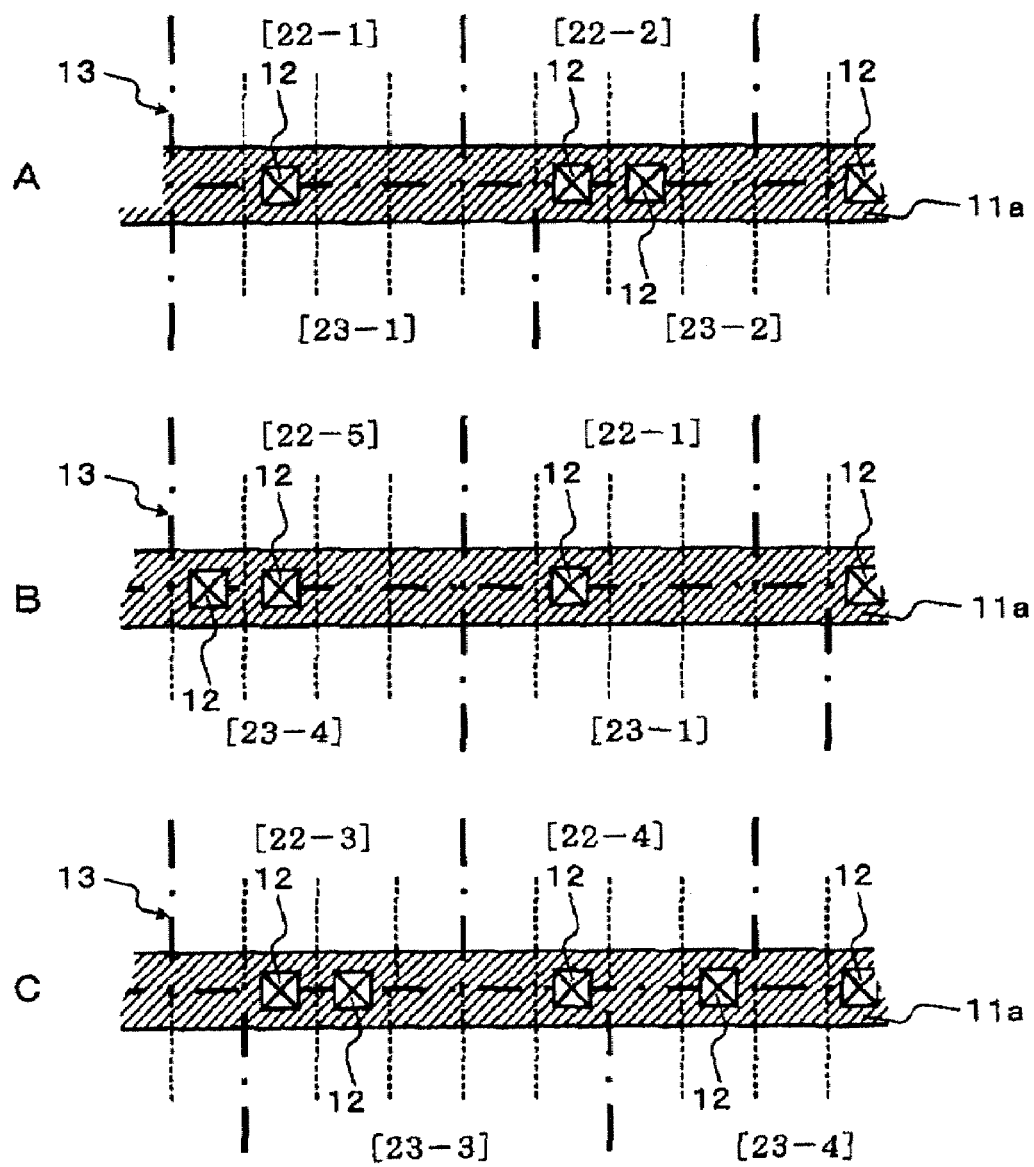
FIGS. 8A-8C are layout charts showing the standard cells 21 and standard cells 23 vertically arranged to share the power supply interconnection according to the embodiment of the present invention.

FIG. 8 is a layout chart showing the standard cell 22 and the standard cell 23 according to the embodiment of the present invention. The standard cells 22, 23 are arranged a lower and an upper layer, respectively, to share the power supply interconnections. Here, a combination of the standard cells 22, 23 is shown in FIG. 5, where the standard cell 22 having the width W of 4d is arranged in the lower layer and the standard cell 23 having the width W of 5d is arranged in the upper layer. In this case, combination of the four standard cells 22([22-1]-[22-5] in FIG. 8) and the three standard cells 23([22-1]-[21-4] in FIG. 8) are repeatedly arranged.

In FIG. 8A, the combination of the standard cells 22 ([22-1]-[22-3] and [23-1]-[23-2]) are illustrated. In FIG. 8 B, the combinations of the standard cells 22([22- 5], [22-1], and [23-4], [23-1]) are illustrated. In FIG. 8C, the combination of the standard cells 22 ([22-3]-[22-4] and [23-3], [23-4]) are illustrated.

The via contacts 12 is formed as the continuous grid by the combination as shown in FIG. 8. As a result, a maximum number of the continuous grid is two. Three or more via contacts 12 are not continuously formed. Moreover, in the case that one of the standard cells 22 is horizontally arranged in reverse, however, the discussion mentioned above can be easily estimated the same as the normal case.

Figure 9:
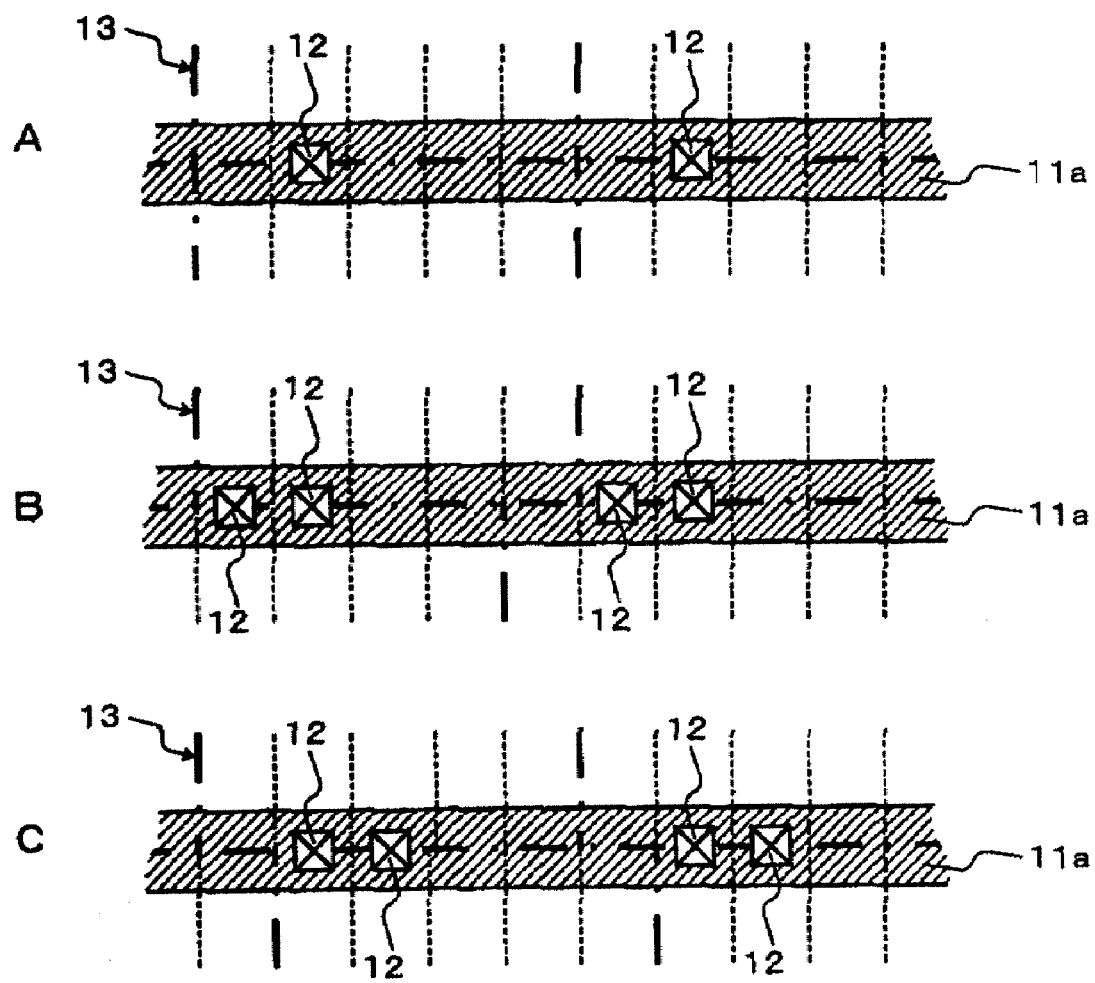
FIGS. 9A-9C are layout charts showing the standard cells 23 vertically arranged to share the power supply interconnection according to the embodiment of the present invention.

FIG. 9 is a layout chart showing the standard cell 23 according to the embodiment of the present invention. The standard cells are arranged an upper layer and a lower layer to share the power supply interconnections. Here, a combination of the standard cells having the width W of 5d is shown in FIG. 9, where the standard cells are vertically and horizontally arranged as a close packing layout.

In FIG. 9A, the upper and the lower standard cells are arranged so that the via contact 12 in the upper and the lower standard cells mutually overlaps. The via contacts 12 of the power supply interconnection 11a are arranged in FIG. 9A.

In the cell arrangement as shown in FIG. 9A, the via contacts 12 of the upper and the lower standard cells are all arranged to mutually overlap. After arranging, via contacts 12 are formed mutually apart the width W of 3d.

The via contact 12 of the power supply interconnection 11a is shown in FIG. 9B, where the lower standard cell 23 is misaligned the width W of 5d to the left side for the upper standard cell 23. In this case, as shown in FIG. 9B, the two via contacts 12 are formed to make the continuous grid. However, the via contact 12 of each standard cell is apart at least the width W of 1.5d from the end of the cell frame. Therefore, the three or more via contacts 12 are not continuously arranged.

The via contact 12 of the power supply interconnection 11a is shown in FIG. 9C, where the lower standard cell is misaligned the width W to the right side for the upper standard cell 21. Therefore, in this case, the three or more via contacts 12 are not continuously formed as the same as in FIG. 9B.

Furthermore, as not shown in FIG. 9, however, the via contact 12 is formed at the interval of 2d or 3d in the case that the upper and the lower standard cells are misaligned mutually the width W of 2d. As a result, the grid being not continuously formed can be easily estimated.

As mentioned above and shown in FIG. 4-FIG. 9, whatever the standard cell are combined, the via contacts 12 formed on the power supply interconnection 11a can be not formed of three or more the continuous grid in the standard cell 21-23 having the width W of 3d-5d. Moreover, when the via contact 12 arranged in the standard cell is over the width W of 6d, the discussion mentioned above can be easily estimated as the same as the normal case in the condition of the equation (1).

In the case that the width W is 3d, W is equivalent to the standard cells 21 of n. In the case that the width W is (3n+1)d, W is equivalent to the standard cells 21 of the standard cells 21 of n plus the standard cell 22. In the case that the width W is (3n+2)d, W is equivalent to the standard cells 21 of the standard cells 21 of n plus the standard cell 23.

According to the embodiment mentioned above, the standard cell having the three or more via contacts being continuously adjacent arranged on the power supply interconnection and the cell library using the standard cell can be realized by the automatic layout program.

According to the embodiment mentioned above, in the case that the plurality of via contacts 12 are arranged in the standard cell, the interval Dc is the width of 3d for lowering resistance between the power supply interconnection 11a or 11b and the substrate. However the present invention is not restricted, the interval Dc may be principally more than three. For example, a number of the via contacts fully retained and suitable resistance between the power supply interconnection 11a or 11b and the substrate make possible to configure the interval of three or more Dc.

Furthermore, as shown in FIG. 4~FIG. 9, the standard cells are vertically arranged to share the power supply interconnection 11a of the power supply voltage, for example, for a simple explanation. However the present invention is not restricted, it is probable to share the power supply interconnection 11b of the earth potential. For example, in the case that three or more cell columns are vertically arranged, the cell columns may be arranged to alternately share the power supply voltage and earth potential.

Furthermore, according to the embodiment mentioned above, the via contact is the through hole to connect the power supply interconnection (the power supply voltage or earth potential) to the substrate. However the present invention is not restricted, for example, in the case that the plurality of power supply interconnections are overlapped, the through hole can be applied to connect between power supply interconnections.

Furthermore, according to the embodiment mentioned above, all of the standard cells in the cell library have the same height H. However the present invention is not restricted, for example, a plurality of groups having different height H can be mixed in the cell library.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:

1. A standard cell, comprising;
    a power supply interconnection, a center line of the power supply interconnection overlapping with a side line along a first direction of a cell frame being an outer frame with a rectangular shape used in an automatic layout program; and
    a via contact connecting between the power supply interconnection and a substrate, the center of the via contact overlapping with the center line of the power supply interconnection,
    wherein a width of the cell along the first direction is an integral multiplication of a grid having a minimum interval on a layout used in the automatic layout program and the center of the via contact is at a distance of at least 1.5 times a number of the grid from a nearest apex of the cell frame.

2. The standard cell according to claim 1,
    wherein a plurality of the via contacts are formed on the power supply interconnection, and the center of each of the via contacts is arranged at a distance of at least 3 times the number of the grid from the center of the adjacent via contact.

3. The standard cell according to claim 2,
    wherein the center of the contact is arranged at a distance of at least 3n times a number of the grid, where n is a counting number, from the center of the adjacent via contact.

4. A cell library comprising;
    a power supply interconnection, a center line of the power supply interconnection overlapping with a side line along a first direction of a cell frame being an outer frame with a rectangular shape used in an automatic layout program;

a via contact connecting between the power supply interconnection and a substrate, the center of the via contact overlapping with the center line of the power supply interconnection; and a standard cell having the center of the via contact being at a distance of at least 1.5 times a number of a grid from a nearest apex of the cell frame, wherein a width of the cell along the first direction is an integral multiplication of the grid and the plurality of standard cells respectively have the cell frame with a same height along a second direction perpendicular to the first direction.

5. The cell library according to claim 4, wherein the standard cell have a plurality of the via contacts, each of the via contacts is formed on the power supply interconnection, and the center of the via contact is arranged at a distance of at least 3 times a number of the grid from the center of an adjacent via contact.

6. The cell library according to claim 5, wherein the center of the contact is arranged at a distance of at least 3n times a number of the grid, where n is counting number, from the center of the adjacent via contact.

7. A method for arranging a via contact, comprising;

forming a cell frame being an outer frame with a rectangular shape used in an automatic layout program, a width of the cell along a first direction of the cell frame being an integral multiplication of a grid having a minimum interval on a layout used in the automatic layout program;

arranging a power supply interconnection, a center line of the power supply interconnection overlapping with a side line along the first direction of the cell frame; and arranging the via contact, the center of the via contact overlapping with the center line of the power supply interconnection, and the center of the via contact being at a distance of at least 1.5 times a number of the grid from a nearest apex in the cell frame.

8. The method for arranging the via contact according to claim 7, wherein the via contact is formed on the power supply interconnection, and the center of the via contact is at a distance of at least 3 times a number of the grid from an adjacent via contact.

9. The method for arranging the via contact according to claim 8, wherein the center of the via contact is at a distance of at least 3n times a number of the grid, where n is a counting number from the center of the adjacent via contact.

10. The method for arranging the via contact according to claim 7, further comprising;

a plurality of standard cells, wherein the height of the cell frames in the standard cells is the same along a second direction perpendicular to the first direction.

11. The method for arranging the via contact according to claim 10, wherein the plurality of standard cells are adjacently arranged to the first direction.

12. The method for arranging the via contact according to claim 11, further comprising;

two layers of the standard cells stacked in layer on the standard cells, wherein via contacts of the two standard cell layers are mutually overlapped.

13. The method for arranging the via contact according to claim 11, further comprising;

two layers of the standard cells being adjacently arranged, the two standard cell layers stacked in layer on the standard cells, wherein a via contact of the one of the two standard cell layers is horizontally misaligned one grid to the via contact of the other one of the two standard cell layers.

14. The method for arranging the via contact according to claim 13, wherein the two layers of the standard cells stacked in layer mutually share the power supply interconnection.

15. The method for arranging the via contact according to claim 13, wherein the width along the first direction of the two standard cell layers is mutually different.

16. The method for arranging the via contact according to claim 10, further comprising;

a substrate having a semiconductor element, wherein the via contact acts as a through hole connecting the power supply interconnection and the semiconductor element.

17. The method for arranging the via contact according to claim 13, wherein the via contact acts as the through hole connecting the power supply interconnections in the two standard cell layers.

* * * * *